(12) United States Patent
Michaluk

(10) Patent No.: US 6,921,470 B2
(45) Date of Patent: Jul. 26, 2005

(54) METHOD OF FORMING METAL BLANKS FOR SPUTTERING TARGETS

(75) Inventor: Christopher A. Michaluk, Gilbertsville, PA (US)

(73) Assignee: Cabot Corporation, Boston, MA (US)

( * ) Notice: Subject to any disclaimer, the term of this patent is extended or adjusted under 35 U.S.C. 154(b) by 0 days.

(21) Appl. No.: 10/366,650

(22) Filed: Feb. 13, 2003

(65) Prior Publication Data

US 2004/0159545 A1 Aug. 19, 2004

(51) Int. Cl.$^7$ .............................................. C23C 14/34
(52) U.S. Cl. ............................... 204/298.13; 204/298.12
(58) Field of Search ........................ 204/298.12, 298.13

(56) References Cited

U.S. PATENT DOCUMENTS

| 5,693,203 | A | * | 12/1997 | Ohhashi et al. | ........ 204/298.12 |
| 6,071,389 | A |   | 6/2000  | Zhang | ................... 204/298.12 |
| 6,238,494 | B1 |   | 5/2001  | Segal | .......................... 148/421 |
| 6,331,233 | B1 |   | 12/2001 | Turner | ................... 204/298.13 |
| 6,348,113 | B1 |   | 2/2002  | Michaluk et al. | ........... 148/668 |
| 6,348,139 | B1 |   | 2/2002  | Shah et al. | ............. 204/298.13 |
| 6,464,847 | B1 | * | 10/2002 | Kumahara et al. | ..... 204/298.12 |
| 6,566,161 | B1 |   | 5/2003  | Rosenberg et al. | ........... 438/77 |
| 2001/0001401 | A1 |   | 5/2001  | Segal | .......................... 148/670 |

FOREIGN PATENT DOCUMENTS

| GB | 1483195 | 8/1977 | ............ B21D/1/10 |
| JP | 02122071 A | * 5/1990 | ............ C23C/14/34 |
| WO | WO 87/07650 | 12/1987 | ............ C23C/14/34 |
| WO | WO 96/33294 | 10/1996 | ............ C23C/14/34 |
| WO | WO 99/61670 | 12/1999 | ............ C22B/34/24 |
| WO | WO 02/088412 A2 | 11/2002 | ............. C22F/1/00 |

OTHER PUBLICATIONS

English translation of JP 2–122071.*
International Search Report for PCT/US2004/004021 dated Oct. 26, 2004.
S. I. Wright et al. "Textural and Microstructural Gradient Effects on the Mechanical Behavior of a Tantalum Plate", Metallurgical and Materials Transactions A, vol. 25A, May 1994, pp. 1025–1031.
D. Raabe et al. "Texture and Microstructure of Rolled and Annealed Tantalum", Materials Science and Technology Apr. 1994, vol. 10, pp. 299–305.
J. B. Clark et al. "Effect of Processing Variables on Texture and Texture Gradients in Tantalum", Metallurgical Transactions A, vol. 22A, Sep. 1991, pp. 2039–2048.
J.B. Clark et al. "Influence of Transverse Rolling on the Microstructural and Texture Development in Pure Tantalum", Metallurgical Transactions A, vol. 23A, Aug. 1992, pp. 2183–2191.

* cited by examiner

Primary Examiner—Steven VerSteeg

(57) ABSTRACT

The present invention relates to an improvement in the manufacture of metal blanks, discs, and sputtering targets by flattening only one of the two surfaces of a metal plate. The elimination of flattening the metal plate's second surface results in a significant cost reduction. The metal plate of the present invention preferably has a single-side flatness of 0.005 inches or less, which improves the reliability of the bond between the target blank and a backing plate. Preferred metals include, but are not limited to, tantalum, niobium, titanium, and alloys thereof. The present invention also relates to machining the first side of a metal plate, bonding the first side to a backing plate, and then optionally machining the second side of the metal plate.

5 Claims, 1 Drawing Sheet

METHOD OF FORMING METAL BLANKS FOR SPUTTERING TARGETS

BACKGROUND OF THE INVENTION

The present invention relates to a method for making sputtering targets that reduces machine costs and improves quality and reliability, relative to conventional methods for preparing sputtering targets. The present invention further relates to methods of preparing improved metal discs. The present invention also relates to a method for reducing the manufacturing costs of sputtering targets and/or metal discs.

In the field of metal fabrication in general, and sputtering targets in particular, significant difficulties arise with regard to the costs associated with producing planar discs with very highly specific dimensional requirements. It is common practice in the field of manufacturing a metal disc to flatten both sides of a metal blank which is eventually formed into a metal disc, for example, a tantalum sputtering target preform. This requires the grinding of both sides of the metal blank, rolling both sides, or press flattening and/or surface conditioning of both sides of the metal.

Thus, for instance, a planar sputtering target preform can be machined from a rolled metal plate. Other methods of manufacturing sputtering target preforms, such as forging and subsequently processing of cylindrical metal billets, can be used. Typically, the dimensions of the sputtering target preform are larger than the dimensions of the resultant finished sputtering target blank after bonding onto a backing plate and finish machining operations are completed to produce a sputtering target assembly.

The manufacturing of a planar tantalum sputtering target involves the rolling of tantalum plate to a gauge that is typically 0.010–0.100 inches greater than the thickness of the finish machined target blank and a thickness tolerance of about 5–10% of the rolled gauge, level rolling to a nominal flatness of 0.050 inches, annealing the plate, rough cutting of blanks from the plate, several labor-intensive iterations of manual press flattening and surface conditioning to attain a flatness of 0.010 inches or less, and then machining the blanks to a desired diameter. These preform blanks are then sold to a sputtering target manufacturer, who bonds the blank to a backing plate, and then machines the face and diameter of the bonded preform to the dimensional requirements for the assembled sputtering target as specified by the sputtering equipment Original Equipment Manufacturer (OEM) or the target supplier's customers.

However, often the final metal disc or sputtering target produced is utilized in an application where, in fact, only one side of the disc or sputtering target truly benefits from and/or needs the highly specific dimensional properties.

Because of the high intrinsic cost and value of, for instance, tantalum, efforts are commonly taken to reduce the generation of scrap in the various manufacturing processes associated with tantalum. The target suppliers place tight dimensional tolerances on gauge and diameters of the blanks to minimize the weight of the material they purchase. Furthermore, the target suppliers would prefer blanks that meet a flatness of 0.005 inches, which would significantly improve the reliability of the bond between the target blank and the backing plate. However, achieving such stringent tolerances in gauge and flatness requires the grinding and the lapping of the blanks, a process which is prohibitively expensive and generates excessive amounts of low-value grinding scrap called swarf. Typically, the value of the tantalum contained in the swarf is less than the value of tantalum turnings generated by machining operations since it is often difficult and expensive to separate the tantalum particles from the grinding media comprising the swarf, and because of the greater propensity for contamination of the tantalum by grinding compared to machining.

Accordingly, there is a need to overcome one or more of the above described disadvantages.

SUMMARY OF THE INVENTION

A feature of the present invention is to provide a method to manufacture cost-effective metal products. The present invention relates to avoiding the costs associated with time, labor, and lost metal material, which incurs during the grinding of both surfaces of a metal planar object.

Another feature of the present invention is to modify the tolerances of the tantalum or other metal target blanks to thereby enhance production of the metal blank, disc, and the sputtering target.

Another feature of the present invention is to provide a method for manufacturing metal blanks, by flattening only the first surface of a plate to a flatness of about 0.005 inch or less.

A further feature of the present invention is to provide a method for manufacturing metal discs.

Another further feature of the present invention is to provide a metal blank, which has been single-side machined, that can be bonded to a backing plate and the resulting composite subsequently shaped, cut, or configured to form a desired sputtering target.

A further feature of the present invention is to provide a method to improve or reduce the cost of manufacturing metal blanks, discs, and metal sputtering targets.

Another further feature of the present invention is to provide a method for manufacturing a metal article from a metal plate or a metal blank whereby the value of the material removed from the article during manufacturing is maximized.

Another further feature of the present invention is to provide a method for manufacturing a metal article that reduces the amount of contamination of the removed material.

Another feature of the present invention is to provide a method for reducing the cost of manufacturing a metal disc from a metal plate or a metal blank.

A further feature of the present invention is to provide a method for reducing the cost of manufacturing a metal sputtering target from a plate, a blank, or a disc.

Additional features and advantages of the present invention will be set forth in part in the description that follows, and in part will be apparent from the description, or may be learned by practice of the present invention. The objectives and other advantages of the present invention will be realized and attained by means of the elements and combinations particularly pointed out in the written description and appended claims.

To achieve these objectives and other advantages and in accordance with the purposes of the present invention, as embodied and broadly described herein, the present invention relates to a method of manufacturing a metal blank or a disc by supplying at least one planar metal plate having a first surface and a second surface, wherein the first and the second surfaces are essentially parallel; and flattening only the first surface of the plate to about 0.005 inches or less, whereby a metal blank is produced.

The present invention also relates to a method of forming a sputter target assembly by providing a metal sputter target preform which comprises a metal disc, providing a backing plate and providing an optional bonding agent, and subjecting the target preform, backing plate and optional bonding agent to a sufficient temperature and a sufficient pressure for a sufficient time to provide, accept, or achieve a bond between the metal target and the backing plate.

It is to be understood that both the foregoing general description and the following detailed description are exemplary and explanatory only and are intended to provide a further explanation of the present invention as claimed.

DETAILED DESCRIPTION OF THE PRESENT INVENTION

Figure 1:
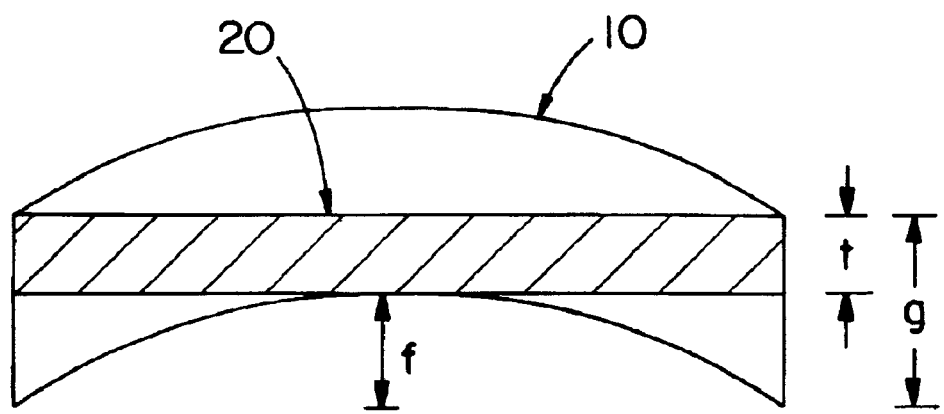
FIG. 1 is a cross-sectional schematic diagram of a rolled metal plate and a sputter target that is produced after machining said rolled metal plate.

The present invention relates to supplying metal blanks, discs, and sputtering targets with one flat side. Having only one flat surface or side can offer several benefits as compared to the conventional metal disc production process.

For the purposes of the present invention "essentially parallel" can be defined as planes which do not intersect. Thus, it is not a critical limitation of the present invention for the surfaces of the metal plate to exhibit highly specific dimensional properties, such as absolute parallel surfaces. A person skilled in the art can determine the degree of deviation of the surfaces of the metal plate, blank, disc, and/or sputtering target from true parallel, which can be effective within the present invention.

In general, "blanks" can be defined as metal bodies useful for the fabrication of discs and/or sputtering targets. No specific limitations on dimensions of the blanks are known within the present invention. In general, the terms "blanks" and "preforms" can be used interchangeably. In general, "metal plate" can be defined as any metal in continuous form, such as extruded, pressed or rolled ingot-metallurgy or powder-metallurgy derived sheet or billet or other non-powder or non-flaked form.

In general, "a flatness of X inches" can be understood as the measure of deviation from flat, or a perfect plane, at any one point relative to the total surface, where flat is 0.000 inches.

In general, "disc" can be understood as, inter alia, a right circular cylinder with a thickness to diameter ratio of 1 or less. "Disc" herein also includes ovals, triangles, rectangles, and other polygons. When a disc is a rectangle, it preferably includes corners that are at least partially rounded. There are no known size limitations on the disc of the present invention.

In general, "sputtering target" can be understood as a source material for depositing thin films such as by physical vapor deposition. Common sputtering target materials useful herein include, but are not limited to, metal, such as tantalum, copper, titanium, cobalt, niobium, platinum, silver, gold, aluminum, and combinations thereof or alloys thereof.

In general, "backing plate" can be understood as any material, chemical compound, metallic substrate, adhesive, foundation or other structural support which can contact the blank, disc, or sputtering target. The metals above are also examples of suitable metals for the backing plate.

In general, "bonding agent" can be defined as any material, chemical compound, metallic substrate, adhesive, foundation or other structural support which . promotes the formation of a bond between the blank and the backing plate.

In general, grinding is defined as the process of removing material from work-pieces by the cutting action of a solid, rotating, grinding wheel composed of abrasive grains or grit plus a bonding material.

In general, machining is defined as any process to remove material from a metal plate or disc by using a non-consumable tool bit without using abrasive grains or grit that can be dislodged to contaminate the scrap metal.

In the present invention, the words "face", "side," and "surface" may be used interchangeably.

In the present invention, the words "sputtering target" and "sputter target" may be used interchangeably.

Flattening one surface of a metal can remove any surface imperfections, such as ripples, voids, concavities, or convexities that can hinder the bonding integrity.

Having only one flat surface can minimize or completely eliminate iterative press flattening operation, since the primary purpose of the press flattening operation is to produce preforms having faces that are sufficiently flat to allow for subsequent bonding to the backing plates. Press flattening has been identified as the cost driver in the machining cost of manufacturing metal target blanks, which represents the bottleneck in the blank machining process. While this process may necessitate increasing the gauge tolerance of the blank to assure that the blanks meet the finished tolerances after the bonding and machining steps, the expectant savings in labor and inventory costs will more than offset the slight additional material yield costs. Any additional manufacturing costs incurred by the target suppliers will be minimal, since no new machining steps are being introduced or required by the present invention.

Further, in addition to the actual loss of metal in unnecessary grinding steps, the value of the scrap itself can be significantly improved or increased by the present invention. Swarf value recovered from the grinding of both surfaces of a tantalum disc has a current value of about fifty dollars ($50.00) per pound of contained tantalum because the grinding materials dislodged from the grinder can mix with the scrap metal as impurities and lower the value of the scrap metal. Tantalum can be recovered from grinding swarf using the same chemical separation and reduction processes employed to refine tantalum from raw ore. Also, mechanical separation processes, such as but not limited to, gravity separation, frothing, or magnetic separation can also be used, but these processes are inefficient in separating all of the tantalum and the grinding media leading to low tantalum reclaim yields, and is inefficient in separating all of the grinding media from the tantalum, resulting in contamination of the tantalum. As such, the value of the tantalum in grinding swarf is similar to the value of tantalum in native ore. The scrap metal recovered from machining of a single surface of a tantalum disc has a current value of approximately one hundred dollars ($100.00) per pound of contained metal because machining does not introduce any contaminants or only introduces negligible amount of contaminants into the scrap metal. Tantalum machining scrap can be readily melted into tantalum ingots without the need for chemical refining and reduction processes, and hence retains the value-added from these processes.

Thus, producing metal target blanks with one flat surface results in significant savings in manufacturing costs, and a subsequent increase in machine shop throughput. The present invention is therefore ideal for materials with a large spread in scrap grade value, e.g., tantalum, high purity copper, and titanium, and the like.

In a similar manner, significant cost savings can result during the subsequent preparation of the disc and sputtering targets.

Preferably, the metal blank, disc, and sputtering target having only one flat side are made from valve metals or other metals. Preferably, they are made from, for example, tantalum, copper, aluminum, titanium, niobium, cobalt, platinum, silver, and gold. Other examples include alloys containing one or more of these metals. A preferred metal is tantalum.

Preferably, the flat surface of the metal blank, disc, or sputtering target has a flatness of from about 0.060 inches to about 0.001 inches, and more preferably, has a flatness of about 0.005 inches or less. Preferably, the metal blank has a nominal thickness tolerance of +0.100/−0.00 inches for blank thicknesses of from about 0.250 to about 0.500 inches, and +0.050/−0.00 inches for blank thicknesses less than about 0.250 inches. The nominal diameter tolerances according to the present invention can be +0.025/−0.00 inches for discs having diameters of from about 2 to about 24 inches. Preferably, the metal blank has a nominal thickness tolerance of at least about 5% of the rolled gauge of the plate and more preferably, a tolerance of from about 5% to about 10% of the rolled gauge of the plate. The non-flattened surface, or the second surface, of the metal blank, disc, or sputtering target can have a flatness of from about 0.010 inches or less to about 0.075 inches or more. Preferably, the second surface has a flatness of from about 0.025 inches or less, and more preferably, the second surface has a flatness of from about 0.015 inches or less.

In one example, a metal blank with a first surface machined or otherwise conditioned to a flatness of 0.005 inches or less can first be shaped into a disc and then be fixed to a backing plate, or can immediately be bonded to a backing plate and later be altered or redefined.

In one example, the second surface of the metal blank is also flattened. Supplying metal blanks, discs, and sputtering targets with both sides flattened by machining can offer several benefits compared to the conventional metal discs produced by grinding.

The second surface or side of the metal blank, disc, or sputtering target can be machined to a flatness of from about 0.025 inches or less and preferably the second side is machined to a flatness of about 0.005 inches or less. The machining of the second surface can be done following the bonding of the sputtering target preform onto the backing plate as part of the finish machining step of the assembled sputtering target.

As stated earlier, machining a metal plate does not introduce or only introduces a negligible amount of contaminants to the scrap metal. Thus, the scrap metal produced by machining both sides of a metal plate has a higher value (current value of about $100 per pound) than the scrap metal produced by grinding both sides of a metal plate (current value of about $50 per pound contained tantalum). Thus, machining both surfaces of a metal plate instead of grinding reduces the overall cost of producing metal blanks, discs, and sputtering targets.

The method for producing a sputtering target assembly is not limited to the order or sequence of the steps in the fabrication of a sputtering target. The method for forming a sputtering target assembly preferably includes connecting or affixing a sputter target, such as a metal blank or a metal disc to a backing plate.

Any method known to one skilled in the art can be used to connect or affix the sputter target to a backing plate. For example, the sputter target can be adjoined to the backing plate or backing plate precursor composition by using an adhesive material, by pressure-fitting, by hot melting, by soldering, by brazing, by diffusion bonding, explosion bonding, or by using a mechanical device, such as a clamp.

Furthermore, the sputter target assembly can optionally contain an interlayer material that can act as a bonding aid between the target blank and the backing plate. The interlayer material can be in the form of a thin film coating applied by electroplating, electroless plating, vapor deposition, ion beam deposition, or other suitable means for depositing a thin film. The interlayer can also be in the form of a foil, plate, or block. Examples of interlayer materials can include, but are not limited to, zirconium as found in U.S. Pat. No. 6,376,281, titanium as found in U.S. Pat. No. 5,863,398 and U.S. Pat. No. 6,071,389, copper, aluminum, silver, nickel, and alloys thereof, as found in U.S. Pat. No. 5,693,203, and graphite as found in U.S. Pat. No. 6,183,613 B1, each of which is incorporated in its entirety by reference herein.

The backing plate, interlayer and/or bonding agent can be made from any material, chemical compound, metallic substrate, adhesive, or foundation that can provide structural support.

In one example, the second surface is flattened after the first surface has achieved a flatness of about 0.005 inches or less. Preferably, the second surface is flattened after the metal blank is adjoined to a backing plate. Preferably, the second surface of the target is flattened by machining. The backing plate can provide ample support when machining the second surface of the target. By not providing a backing plate to support the target, the target can bend. Thus, there would be a need to only partially machine the first surface, then partially machine the second surface, and continue altering between the first surface and the second surface to prevent bends from forming in the target. This process would be very time-consuming and expensive. Also, machining of the second surface after bonding to the backing plate is typically necessary to assure the dimensional specifications defined by the OEM or target manufacturer. Therefore, the use of a backing plate when machining the second surface can reduce the cost of production and avoid redundant machining operations.

A preferred method to manufacture the metal blanks, which can be part of the sputtering target of the present invention, includes supplying at least one metal plate having a first surface and a second surface, wherein the first and the second surfaces are essentially parallel. Preferably, the first surface of the metal plate is flattened to form a metal blank, which can then either be shaped to a disc, which is then affixed to a backing plate, or the flattened first surface of the metal blank can be directly affixed (e.g., bonded) to the backing plate, whose shape can later be altered or re-defined.

The sequence of steps recited in the present invention is not critical to the invention. Thus, for example, one skilled in the art can roll out the metal plate into a sheet, which has been single-face machined to form a blank, then cut, machine, or otherwise shape the blank to form a disc. The disc can then be affixed to a backing plate to form a sputtering target assembly. Alternatively, one can cut the shape and size of the desired final sputtering target, or the disc and then machine the first surface to its desired flatness.

Preferably, the first surface of a metal is flattened from about 0.025 inches or less and more preferably it is flattened to about 0.005 inches or less. Preferably, the first surface of the metal blank is flattened by a machining process. As stated earlier, the scrap metal from a machining process has a higher value than the scrap metals from a grinding process because machining does not introduce any contaminants or only introduces a negligible amount of contaminants into the scrap metal. Thus, the grinding swarf can have a value of about $50 per pound of contained tantalum, while the scrap metal recovered from machining can have a value of about $100 per pound.

Preferably, the machining process, which flattens the first surface to about 0.005 inches or less provides a nominal thickness tolerance of +0.100/−0.00 inches for a blank thickness of from about 0.250 to about 0.500 inches and a nominal thickness tolerance of +0.050/−0.00 for blank thickness of about 0.250 inches or less.

The second surface of the metal blank, which is preferably not machined at this time, can have a flatness of from about 0.075 inches or less and preferably 0.025 inches or less. Preferably, the process for forming a metal sheet creates a second surface which includes a flatness of from about 0.060 inches to about 0.005 inches, and more preferably, of from about 0.030 inches to about 0.005 inches. The second surface can be flattened by level rolling of the plate, stretching flattening, press flattening, milling, grinding, or lapping of the metal plate or the sputtering target blank.

In another example, one can start with a cylinder or billet of metal, such as tantalum, which is then forged to form a round-shaped planar object, which can be machined into a disc. For purposes of this invention, a blank and/or a plate can include billets (e.g. forged billets) and the like.

The present invention will be further clarified by the following examples, which are intended to exemplary of the present invention.

EXAMPLES

Example 1

FIG. 1 shows a rolled metal plate (10) having an as-rolled or as-level-rolled flatness designated "f" and an initialized gauge thickness of "g." A planar sputtering target (20) of finished thickness "t" can be produced. Generally, the relationship between initial thickness with respect to initial flatness and finished thickness is $$g=t+(2f+0.005")$$

The amount of scrap generated in producing a target 20 from plate 10 can be calculated using the following formula:
$V_s=(2f+0.005")\cdot A_T\cdot\rho_{Ta}$ $A_T$=target area $\rho_{Ta}$=0.060 lbs/in$^3$ and the scrap credit can be calculated using the following formula:

$C_s=V_s (M_s)$ $M_s$=marked value of scrap $V_s$=volume of scrap
$C_s$=Scrap credit Consider the manufacturing costs of a tantalum blank 14" in diameter (154 in$^2$) and 0.250" thick, and standard plate manufacturing cost ($C_{st}$) of $250/lb.

Case 1 Double disc grinding of as level rolled blanks to 0.005" flat

Assume: initial flatness f=0.075"
  grinding cost=$C^g_m$=$50 per disc
  grinding swarf value $M_s^g$=$50/lb
Initial plate thickness g=t+(2f+0.005)
  g=0.250+2(0.075)+0.005
  g=0.405 in
Initial plate cost=g·$A_t$·$\rho_{Ta}$·$C_{ST}$
  (0.405 in)(154 in$^2$)(0.60 lbs/in$^3$)($250/lb)=$9355

Manufacturing yield t/g
  (0.250)/(0.405)=0.62
Scrap Credit+(2f+0.005)$A_t$·$\rho_{Ta}$·$M_s^g$
  (2(0.075)+0.005)(154 in$^2$)(0.60 lb/in$^3$)($50/LB)=$716
Yielded manufacturing cost $$\frac{\text{Initial Plate Cost}}{\text{Mfg Yield}} + \text{Grinding Cost} - \text{Scrap Credit}$$

$$\frac{9355}{0.62} + 50 - 716 = \$14423$$

Case 2 Press flattening and face machining to 0.005" flat

| Assume | As-pressed flatness | f = 0.010" |
| | Flattening Labor Cost | $C_m^F$ = $100/disc |
| | Machining Labor Cost | $C_m^m$ = $500/disc |
| | Machining Scrap Value | $M_s^M$ = $100/lb |

Initial Plate thickness=0.275"
Initial Plate cost=$6352
Manufacturing Yield=0.91
Scrap Credit=$231
Yielded Manufacturing Cost=$6999
Case 3 Machine 1 side flat to 0.005"
Assume as level rolled flatness of 0.075"

| Machining Labor Cost | $100/disc |
| Machining Scrap Value | $100/lb |

Initial plate thickness=0.405"
Initial plate cost=$9355

$$\text{Manufacturing Yield} = \frac{(0.405 - f \cdot 0.005)}{(0.405)} = 80$$

Scrap Credit: $(0.080)(A_f)(\rho_{Ta})(M_s^M)=\$739$
Yielded Manufacturing Cost=$11055
Case 4 Press Flatten to 0.010" and machine 1 side flat to 0.005"

Assume As—press flatness of 0.010"
  Flattening Labor Cost=$100/disc
  Machining Labor Cost=$150/disc
  Machine Scrap Value=$100/lb
Initial plate thickness=0.225"
Initial plate cost=$6352

$$\text{Manufacturing Yield} = \frac{0.275 - 0.010 - 0.005}{0.275} = 0.95$$

Scrap Credit$(0.015)(A_f)(\rho_{Ta})(M_s^M)=\$139$
Yield Manufacturing Cost=$6797

Other embodiments of the present invention will be apparent to those skilled in the art from consideration of the specification and practice of the invention disclosed herein. It is intended that the specification and examples be considered as exemplary only, with a true scope and spirit of the invention being indicated by the following claims and equivalents thereof.

What is claimed is:

1. A sputtering target comprising two essentially planar surfaces, wherein, prior to being attached to a backing plate, said sputtering target has a first surface having a flatness of about 0.005 inch or less, and wherein a second surface has a flatness of about 0.075 inch to about 0.025 inch.

2. The sputtering target of claim 1, wherein said sputtering target comprises titanium, cobalt, aluminum, copper, tantalum, niobium, platinum, gold, silver, or alloys thereof.

3. The sputtering target of claim 1, wherein said sputtering target is tantalum.

4. The sputtering target of claim 1, wherein said sputtering target is niobium.

5. A sputtering target assembly having a metal target bonded to a backing plate produced by a method comprising the steps of:

(a) providing a metal sputter target which comprises a metal blank prepared by:

(1) supplying at least one planar metal plate having a first surface and a second surface, wherein said first and said second surfaces are essentially parallel; and (2) flattening only said first surface of said metal plate whereby a metal blank is produced; and (b) bonding said backing plate onto said metal blank wherein, prior to being attached to said backing plate, said sputtering target has a first surface having a flatness of about 0.005 inch or less, and wherein a second surface has a flatness of about 0.075 inch to about 0.025 inch.

* * * * *